United States Patent [19]

Perry

[11] Patent Number: 5,418,693
[45] Date of Patent: May 23, 1995

[54] ELECTROSTATIC DISCHARGE PROTECTION FOR INSTRUMENT CLUSTER

[75] Inventor: Kenneth D. Perry, New Lothrop, Mich.

[73] Assignee: Delco Electronics Corporation, Kokomo, Ind.

[21] Appl. No.: 180,156

[22] Filed: Jan. 11, 1994

[51] Int. Cl.6 .............................................. H05K 9/00
[52] U.S. Cl. ........................... 361/816; 361/748; 361/750; 361/792; 361/800; 174/35 R; 439/74
[58] Field of Search ............... 361/748, 750, 752, 761, 361/762, 792, 796, 800, 807, 810, 816, 212, 220; 174/35 R, 35 MS; 439/74

[56] References Cited

U.S. PATENT DOCUMENTS

| | | | |
|---|---|---|---|
| 4,092,698 | 5/1978 | Brefka | 361/399 |
| 4,138,711 | 2/1979 | Bremenour et al. | 361/424 |
| 4,203,147 | 5/1980 | Gabr | 361/386 |
| 4,661,888 | 4/1987 | Jewell et al. | 361/424 |
| 4,667,266 | 5/1987 | Masuoka et al. | 361/212 |
| 4,791,524 | 12/1988 | Teigen et al. | 361/212 |
| 5,029,041 | 7/1991 | Robinson et al. | 361/220 |
| 5,031,076 | 7/1991 | Kiku | 361/424 |
| 5,171,936 | 12/1992 | Suzuki et al. | 174/35 MS |
| 5,206,796 | 4/1993 | Thompson et al. | 361/424 |

Primary Examiner—Leo P. Picard
Assistant Examiner—Young Whang
Attorney, Agent, or Firm—Jimmy L. Funke

[57] ABSTRACT

A printed circuit board on the rear of an automotive instrument cluster is covered by a flat panel of polystyrene in contact with the circuit board to protect circuit components against electrostatic discharge. Openings in the panel allow large components which are not sensitive to ESD to protrude beyond the panel.

4 Claims, 1 Drawing Sheet

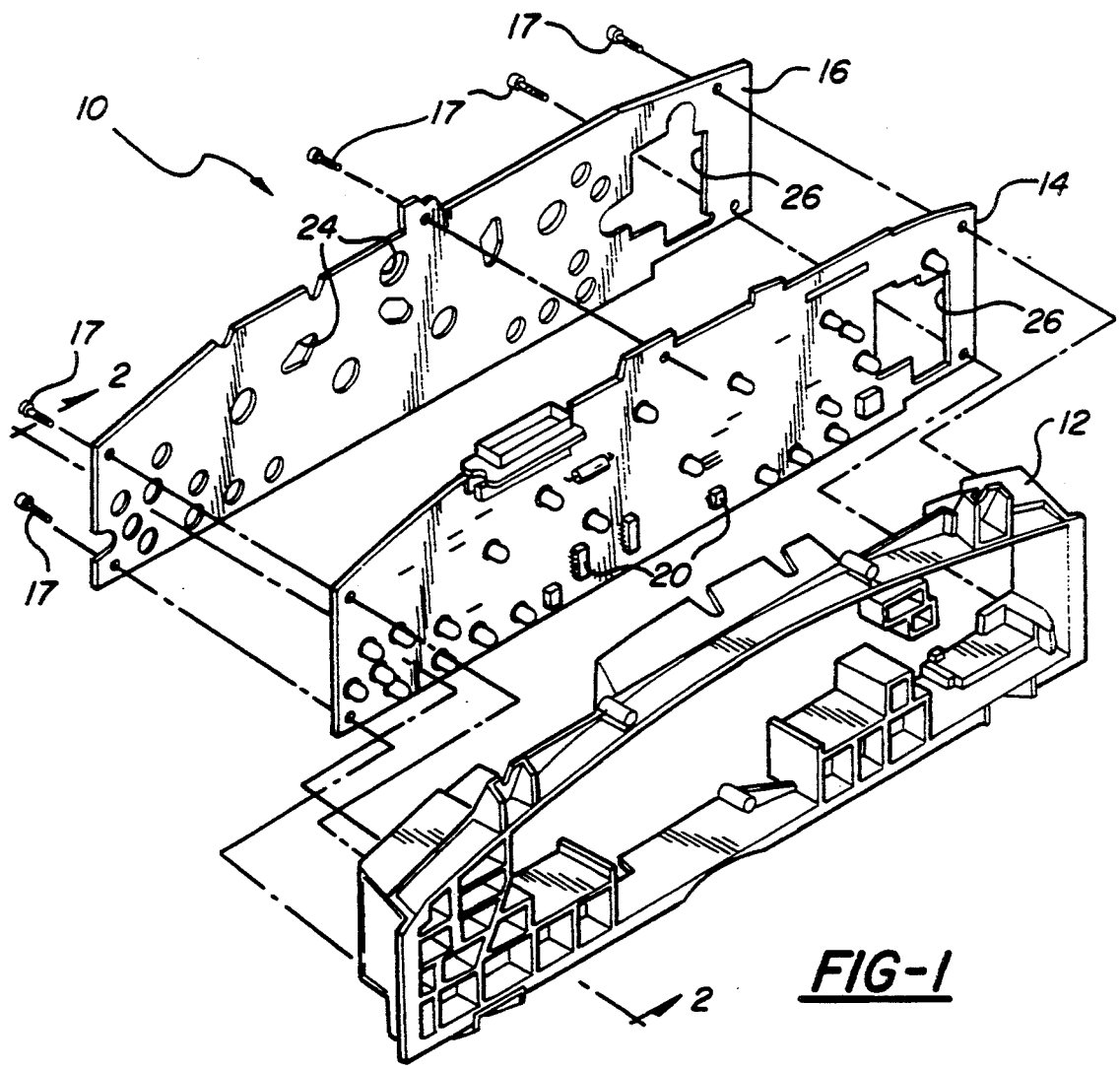
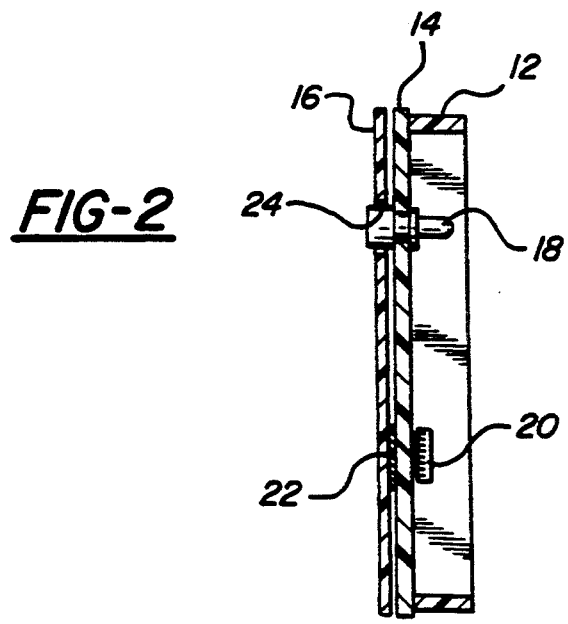

ELECTROSTATIC DISCHARGE PROTECTION FOR INSTRUMENT CLUSTER

FIELD OF THE INVENTION

This invention relates to protection of electronic components from electrostatic discharge and particularly as applied to instrument clusters.

BACKGROUND OF THE INVENTION

It is known that electrostatic discharge (ESD) can cause catastrophic failure in integrated circuit components. A number of proposals have been advanced to protect against such ESD damage which can occur during handling of circuits prior to installation as well as contact after installation. In automotive instrument clusters containing printed circuit boards it is known to cover the back of the board which would otherwise be exposed during assembly of the vehicle and during operation thereafter to isolate the circuits from the ESD sources.

In most ESD protective devices for instrument clusters, a protective panel is secured to the rear of the cluster, spaced from the circuit board. The panel may be sheet metal, for example, wherein the metal dissipates any build-up of charge and also prevents the intimate approach to the circuit board of any object bearing such a charge. Insulating panels have been used in the same manner, acting as a guard against approach, the insulating material itself and the air space between the panel and the circuit board resisting dielectric breakdown due to a high voltage. In some cases a composite or laminate material having both conductive and insulating components are used. It is also known to apply a laminate material directly to the back of the circuit board; such material comprises an insulating inner layer against the circuit board and a conductive foil as an outer layer.

All the panels previously used for instrument cluster ESD protection are expensive, using an expensive material and/or expensive tooling for forming the panels. In the case of sheet metal, the metal is expensive as well as the stamping dies. Insulating covers are often made by injection molding or vacuum forming plastic; in those cases the forming equipment is expensive.

SUMMARY OF THE INVENTION

It is therefore an object of the invention to dramatically reduce the expense of protecting instrument clusters from ESD damage.

The invention is carried out by using an inexpensive material for ESD protection which is easily and inexpensively stamped from sheet stock and which is a flat panel requiring no three dimensional forming. The preferred material is polystyrene; virgin material is preferred but a recycled or reground polystyrene sheet, if it is free of metallic contaminants, is also useful and even less expensive. Moreover, this material is commonly available is rolled sheet form and panels can be stamped out with low cost dies. Polystyrene has been found to provide excellent protection from the high electrostatically developed voltages. The flat protective panel lies flat on the back of the cluster printed circuit board, resting on solder bumps or other small protrusions on the back of the board, but cutouts or windows in the panel accommodate large projections which are not ESD sensitive such as gauge housings or lamp sockets. The printed circuit is sandwiched between a cluster housing and the protective panel, the assembly being secured by peripheral fasteners.

BRIEF DESCRIPTION OF THE DRAWINGS

The above and other advantages of the invention will become more apparent from the following description taken in conjunction with the accompanying drawings wherein like references refer to like parts and wherein:

FIG. 1 is an exploded view of a portion of an instrument cluster assembly having ESD protection, according to the invention; and FIG. 2 is a simplified cross-sectional view of the assembly of FIG. 1 taken along line 2—2.

DESCRIPTION OF THE INVENTION

Referring to the drawings, an automotive instrument cluster 10 comprises a cluster housing 12, a printed circuit board 14, and a protective cover 16, as well as other components containing instruments and graphics, not shown. The housing engages the circuit board at its periphery. The housing 12, the printed circuit board 14 and the protective cover 16 are held together by screws 17 which thread into the housing. The circuit board 14 supports a number of lamps and sockets 18, integrated circuit modules 20 and other electrical devices, all connected to circuit traces, not shown, on the rear surface of the circuit board. Some of the devices on the circuit board, such as integrated circuits have leads extending through small holes in the board and are soldered to the traces, leaving solder bumps 22 on the rear of the circuit board 14. Typically such a circuit board includes screws, clips and other small protrusions which, along with the solder bumps, extend slightly beyond the rear surface of the board. The protective cover 16 seats against the solder bumps 22 and the other small protrusions on the rear surface of the circuit board. Apertures 24 in the cover are aligned with lamp sockets and other large components which are not sensitive to ESD and which extend through the cover 16. Large cutouts 26 in both the circuit board 14 and the cover 16 accommodate an instrument which is too large for containment in the housing.

The protective cover 16 is a flat panel stamped from a sheet of polystyrene. A panel thickness of 0.030 inch has been found to have sufficient hardness to prevent the ends of leads from penetrating the cover and to otherwise protect the circuit during handling. The polystyrene cover has sufficient dielectric strength to prevent electrostatic discharge upon the application of 25,000 volts.

The polystyrene material is readily available in rolled sheet stock and thus is conveniently fed into a stamping apparatus for stamping out the panels including the various required apertures. The panels are punched out of the sheet stock by inexpensive steel rule or match metal dies. The combination of a low cost material and low cost fabricating apparatus yields inexpensive panels. These polystyrene covers cost about 10% as much as stamped metal covers and about 20% as much as composite flat covers comprised of foil laminated to a material similar to cardboard. The polystyrene panels offer comparable savings over vacuum formed covers and injection molded covers.

It will thus be seen that the ESD protection of the subject polystyrene panels is sufficient to meet electronic industry standards at a small fraction of the cost of previously available panels. The panels also afford protection of the printed circuit board during handling of instrument clusters and protect workers handling the clusters from injury by sharp leads or other cutting edges associated with the circuit boards. By using reground polystyrene for the sheet stock even greater savings are possible.

The embodiments of the invention in which an exclusive property or privilege is claimed are defined as follows:

1. An automotive instrument cluster having protection against electrostatic discharge comprising:
   a printed circuit board;
   an instrument housing covering one side of the circuit board;
   a protective board formed of a polystyrene sheet for withstanding breakdown due to electrostatically developed voltages; and
   the protective board covering the other side of the printed circuit board and contacting the circuit board.

2. The invention according to claim 1 wherein:
   the printed circuit board includes large components which are insensitive to electrostatic discharge; and
   the protective board is a planar panel stamped from a sheet of polystyrene material and includes apertures for accommodating the large components.

3. The invention according to claim 1 wherein:
   the printed circuit board has small protrusions such as solder bumps on the other side of the board and extending above the surface of the board; and
   the protective board is in contact with the protrusions.

4. The invention according to claim 1 wherein:
   the protective board comprises a polystyrene sheet made of reground polystyrene.

* * * * *